(12) United States Patent
Akashi et al.

(10) Patent No.: US 10,912,187 B2
(45) Date of Patent: Feb. 2, 2021

(54) PRINTED BOARD

(71) Applicant: Mitsubishi Electric Corporation, Tokyo (JP)

(72) Inventors: Norihiko Akashi, Chiyoda-ku (JP); Yudai Yoneoka, Chiyoda-ku (JP); Nobuyuki Haruna, Chiyoda-ku (JP); Yoshiaki Irifune, Chiyoda-ku (JP); Satoshi Ohdaira, Chiyoda-ku (JP); Takashi Miyasaka, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/610,910

(22) PCT Filed: May 31, 2018

(86) PCT No.: PCT/JP2018/020947
§ 371 (c)(1),
(2) Date: Nov. 5, 2019

(87) PCT Pub. No.: WO2018/225616
PCT Pub. Date: Dec. 13, 2018

(65) Prior Publication Data
US 2020/0163201 A1 May 21, 2020

(30) Foreign Application Priority Data

Jun. 9, 2017 (JP) .................................. 2017-114429

(51) Int. Cl.
*H04B 1/3888* (2015.01)
*H01Q 1/24* (2006.01)
(Continued)

(52) U.S. Cl.
CPC ......... *H05K 1/0219* (2013.01); *H05K 1/0253* (2013.01); *H05K 9/0039* (2013.01); *H05K 2201/09227* (2013.01)

(58) Field of Classification Search
CPC .......... H04B 1/3888; H01Q 1/24; H01Q 1/40; H01Q 1/48; H01Q 1/52; H01Q 7/00; H01Q 7/04; H01Q 9/04; H01Q 9/38; H01Q 9/42
(Continued)

(56) References Cited

U.S. PATENT DOCUMENTS 4,511,900 A * 4/1985 Deasy ...................... H01Q 9/38
343/841
6,614,663 B1 9/2003 Yokota et al.
(Continued)

FOREIGN PATENT DOCUMENTS

JP 10-190166 A 7/1998
JP 2000-049429 A 2/2000
(Continued)

OTHER PUBLICATIONS

International Search Report and Written Opinion dated Aug. 28, 2018 for PCT/JP2018/020947 filed on May 31, 2018, 7 pages including English Translation of the International Search Report.

*Primary Examiner* — Xiaoliang Chen
(74) *Attorney, Agent, or Firm* — Xsensus LLP

(57) ABSTRACT

A printed board including an external interface, a frame ground trace electrically connected to the external interface, a circuit member spaced from the frame ground trace, and a resonance trace disposed between the frame ground trace and the circuit member with a gap present between the resonance trace and the frame ground trace. The resonance trace is connected to the circuit member at at least two positions. The resonance trace and the circuit member
(Continued)

together form a loop member configured in the form of a closed circuit of the resonance trace and the circuit member.

6 Claims, 12 Drawing Sheets

(51) Int. Cl.
*H01Q 1/40* (2006.01)
*H01Q 1/48* (2006.01)
*H01Q 1/52* (2006.01)
*H01Q 7/00* (2006.01)
*H01Q 7/04* (2006.01)
*H01Q 9/04* (2006.01)
*H01Q 9/38* (2006.01)
*H01Q 9/42* (2006.01)
*H05K 1/02* (2006.01)
*H05K 9/00* (2006.01)

(58) Field of Classification Search
USPC .......... 174/261; 235/492; 343/841, 845, 851
See application file for complete search history.

(56) References Cited

U.S. PATENT DOCUMENTS

| 2014/0027520 A1* | 1/2014 | Kato | H04B 5/0075 |
| | | | 235/492 |
| 2014/0300453 A1* | 10/2014 | Takeoka | G06K 7/0008 |
| | | | 340/10.1 |
| 2015/0116168 A1* | 4/2015 | Yosui | H01Q 9/42 |
| | | | 343/722 |
| 2016/0301127 A1* | 10/2016 | Sonoda | H01Q 1/243 |
| 2016/0344439 A1* | 11/2016 | Seol | G06F 1/1656 |
| 2017/0077599 A1* | 3/2017 | Sayama | H01Q 1/523 |
| 2017/0194692 A1* | 7/2017 | Sayama | H01Q 1/48 |

FOREIGN PATENT DOCUMENTS

| JP | 2001-326468 A | 11/2001 |
| JP | 5063529 B2 | 10/2012 |
| JP | 2016-219553 A | 12/2016 |

* cited by examiner

PRINTED BOARD

CROSS-REFERENCE TO RELATED APPLICATIONS

The present application is based on PCT filing PCT/JP2018/020947, filed May 31, 2018, which claims priority to JP 2017-114429, filed Jun. 9, 2017, the entire contents of each are incorporated herein by reference.

TECHNICAL FIELD

The present invention relates to a printed board.

BACKGROUND ART

Recent years have seen progress toward size reduction and high-density mounting of electronic devices. Along with this trend, gaps between traces and between circuit components such as integrated circuit (IC) components on a printed board have become smaller. This has increased the likelihood of an electromagnetic noise generated by electrostatic discharge or the like outside a printed board to propagate to traces and circuit components on a printed board, which means that the likelihood of an electromagnetic noise, when generated, to cause malfunctions of circuit components on a printed board has increased.

As an example, Japanese Patent No. 5063529 (PTL 1) discloses a printed board comprising a slit that is disposed between a frame ground trace and a signal ground trace for the purpose of mitigating propagation of electromagnetic noise to circuit components on the printed board. In the printed board of PTL 1, the frame ground trace is electrically connected to the signal ground trace via a connecting component, which is disposed over the slit. To this connecting component, a conductor is electrically connected. The conductor extends along the slit part and is separated from both the frame ground trace and the signal ground trace.

CITATION LIST

Patent Literature

PTL 1: Japanese Patent No. 5063529

SUMMARY OF INVENTION

Technical Problem

In the printed board of PTL 1, when an electromagnetic noise containing a high-frequency component (of several kilohertz or higher) is applied to a casing of an external interface that is mounted on the frame ground trace, a major portion of the electromagnetic noise propagates on the frame ground trace to a stable potential such as an established grounding or a casing of the apparatus.

However, because the frame ground trace is electrically connected to the signal ground trace via the connecting component, part of the electromagnetic noise propagates on the frame ground trace through the connecting component to a circuit member, which includes the signal ground trace. The conductor cannot sufficiently reduce the amount of electromagnetic noise propagating to the circuit member. As a result, the electromagnetic noise can cause a malfunction of a circuit component mounted on the circuit member, which presents a problem.

The present invention has been devised in light of the above problem, and an object of the present invention is to provide a printed board that is capable of reducing the amount of electromagnetic noise propagating on a frame ground trace to a circuit member.

Solution to Problem

A printed board according to the present invention includes an external interface, a frame ground trace electrically connected to the external interface, a circuit member spaced from the frame ground trace, and a resonance trace disposed between the frame ground trace and the circuit member with a gap present between the resonance trace and the frame ground trace. The resonance trace is connected to the circuit member at at least two positions. The resonance trace and the circuit member together form a loop member configured in the form of a closed circuit of the resonance trace and the circuit member.

Advantageous Effects of Invention

According to the present invention, the resonance trace is disposed between the frame ground trace and the circuit member with a gap present between the resonance trace and the frame ground trace, and the resonance trace is connected to the circuit member at at least two positions. The resonance trace and the circuit member together form a loop member configured in the form of a closed circuit of the resonance trace and the circuit member. This configuration is capable of confining an electromagnetic noise to one side of the resonance trace and thereby preventing the electromagnetic noise from propagating on the frame ground trace to become coupled to the circuit member. Therefore, this configuration is capable of reducing the amount of electromagnetic noise propagating on the frame ground trace to the circuit member.

DESCRIPTION OF EMBODIMENTS

Figure 1:
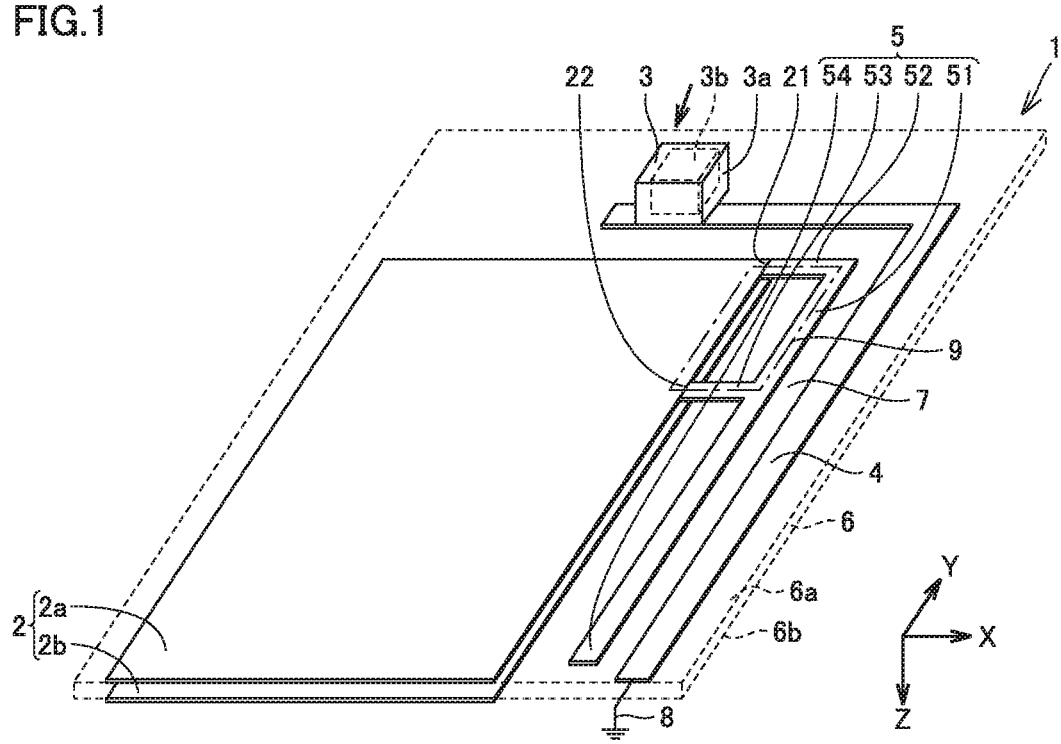
FIG. 1 is a schematic perspective view of the structure of a printed board according to an embodiment 1 of the present invention.

In the following, a description will be given of embodiments of the present invention referring to drawings. Across the embodiments of the present invention, the same components are denoted by the same reference numeral and the same description will not be repeated unless otherwise specified.

Embodiment 1

A description will be given of the structure of a printed board 1 according to this embodiment, referring to FIG. 1. FIG. 1 is a perspective view of printed board 1 according to this embodiment. For the sake of convenience of illustration, a dielectric interposed between conductor layers of the multilayer printed board is depicted with dashed lines in FIG. 1. The following description is of a printed board that includes two conductor layers and one dielectric interposed between these two conductor layers. However, printed board 1 according to this embodiment is not limited to this configuration; it may include three or more conductor layers and may include, between each two adjacent conductor layers, two or more dielectrics.

Printed board 1 according to this embodiment essentially consists of a circuit member 2, an external interface 3, a frame ground trace 4, a resonance trace 5, and a dielectric 6. External interface 3 may be a connector or a switch, for example. External interface 3 includes a casing 3a and a connecting member 3b accommodated within casing 3a.

Circuit member 2 is electrically connected to external interface 3 via a signal trace (not shown). Via external interface 3, a signal is transmitted from outside printed board 1 to circuit member 2. Circuit member 2 is a conductor layer. Circuit member 2 includes a signal trace, a power supply trace, and a signal ground trace. On circuit member 2, a circuit component such as an IC component is mounted. The signal ground trace functions as a reference potential for a signal transmitted to circuit member 2 and for a power supply.

Circuit member 2 includes a first circuit part 2a and a second circuit part 2b. Between first circuit part 2a and second circuit part 2b, dielectric 6 is interposed. First circuit part 2a and second circuit part 2b are electrically connected to each other by a via (not shown). The via is formed in the following manner: a via hole is formed that passes through dielectric 6 interposed between first circuit part 2a and second circuit part 2b; and then a conductor is disposed inside the resulting via hole.

First circuit part 2a is disposed on one surface (a first surface) 6a of dielectric 6. First circuit part 2a extends on the above-mentioned one surface 6a of dielectric 6 in an in-plane direction of this surface. In other words, first circuit part 2a extends in both a first direction (the X direction in FIG. 1) and a second direction (the Y direction in FIG. 1).

Second circuit part 2b is disposed on the other surface (a second surface) 6b of dielectric 6 opposite the above-mentioned one surface 6a. Second circuit part 2b extends on the above-mentioned other surface 6b of dielectric 6 in an in-plane direction of this surface. In other words, second circuit part 2b extends in both the first direction (the X direction in the figure) and the second direction (the Y direction in FIG. 1). Second circuit part 2b is spaced from first circuit part 2a in a third direction (the Z direction in FIG. 1).

The second direction (the Y direction in FIG. 1) is orthogonal to the first direction (the X direction in FIG. 1). The third direction (the Z direction in FIG. 1) is orthogonal to both the first direction (the X direction in FIG. 1) and the second direction (the Y direction in FIG. 1).

Circuit member 2 is spaced from frame ground trace 4. Therefore, circuit member 2 is separated from frame ground trace 4. In other words, circuit member 2 is not in contact with frame ground trace 4.

Frame ground trace 4 is configured to propagate an electromagnetic noise generated by electrostatic discharge or the like to a stable potential 8. The electromagnetic noise generated by electrostatic discharge is an example of various electromagnetic noises. The electromagnetic noise generated by electrostatic discharge contains a high-frequency noise generated by electrostatic discharge.

Figure 10:
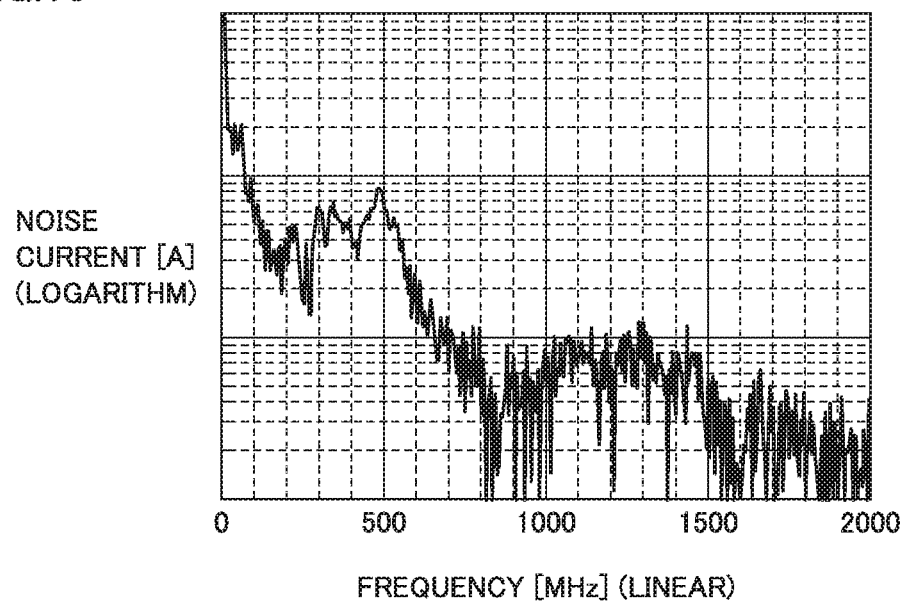
FIG. 10 is a graph depicting a noise current of electrostatic discharge in the printed board according to embodiment 1 of the present invention.

FIG. 10 is a graph depicting a noise current of electrostatic discharge. As is clear from this graph, this noise generated by electrostatic discharge contains a high-frequency noise of up to 2000 MHz. In addition, this example exhibits a characteristic that the noise current reaches its maximum at or near 500 MHz.

Frame ground trace 4 is disposed outside circuit member 2. In the plan view, frame ground trace 4 has a shape of letter L of the alphabet. Frame ground trace 4 is spaced from circuit member 2 in both the first direction (the X direction in FIG. 1) and the second direction (the Y direction in FIG. 2). Frame ground trace 4 is electrically connected to both external interface 3 and stable potential 8.

On frame ground trace 4, casing 3a of external interface 3 is mounted. Casing 3a of external interface 3 is connected to one end of frame ground trace 4. To the other end of frame ground trace 4, stable potential 8 is connected. Stable potential 8 may be a ground potential, for example, or may be equal to the potential of a casing (not shown) of printed board 1.

Resonance trace 5 is disposed between frame ground trace 4 and circuit member 2 with a gap present between resonance trace 5 and frame ground trace 4. More specifically, resonance trace 5 is spaced from frame ground trace 4 in the first direction (the X direction in FIG. 1). Resonance trace 5 is spaced from frame ground trace 4 also in the second direction (the Y direction in FIG. 1).

Between resonance trace 5 and frame ground trace 4, a slit 7 is present. More specifically, slit 7 thus present between resonance trace 5 and frame ground trace 4 separates resonance trace 5 from frame ground trace 4. In other words, resonance trace 5 is not in contact with frame ground trace 4.

Resonance trace 5 is connected to circuit member 2 and constitutes at least part of a loop member 9. In this embodiment, resonance trace 5 is connected to circuit member 2 at two positions. Alternatively, resonance trace 5 may be connected to circuit member 2 at more than two positions.

In this embodiment, resonance trace 5 and circuit member 2 together form loop member 9 that is configured in the form of a closed circuit of resonance trace 5 and circuit member 2. In other words, resonance trace 5 and circuit member 2 together form a closed pathway (a closed circuit).

In this embodiment, resonance trace 5 has a shape of letter F of the alphabet in the plan view. The shape of letter F herein refers to a shape that has one longitudinal line and two lateral lines protruding from the longitudinal line in a direction that crosses the longitudinal line. In the shape of letter F herein, these two lateral lines may protrude from the longitudinal line in a direction that is opposite the corresponding direction in the actual letter F of the alphabet.

A more detailed description will be given of resonance trace 5 according to this embodiment. Resonance trace 5 includes a first extending member 51, a second extending member 52, a third extending member 53, and a fourth extending member 54. First extending member 51 extends in the second direction (the Y direction in FIG. 1). Second extending member 52 is connected to one end (a first end, which is an end in the second direction (the Y direction in FIG. 1)) of first extending member 51, extends in the first direction (the X direction in FIG. 1), and is connected to circuit member 2. Third extending member 53 is connected to the other end (a second end, the other end in the second direction (the Y direction in FIG. 1)) of first extending member 51, extends in the first direction (the Y direction in FIG. 1), and is connected to circuit member 2. Second extending member 52 and third extending member 53 are connected to each other with circuit member 2 being present therebetween.

Fourth extending member 54 is connected to the above-mentioned other end (the other end in the second direction (the Y direction in FIG. 1)) of first extending member 51 and extends in the second direction (the Y direction in FIG. 1). First extending member 51 and fourth extending member 54 are on the same linear line.

First extending member 51, second extending member 52, and third extending member 53, together with a region of circuit member 2 between a first connecting member 21 and a second connecting member 22, form loop member 9. First connecting member 21 is a portion of circuit member 2 that is connected to first extending member 51, and second connecting member 22 is a portion of circuit member 2 that is connected to third extending member 53.

The configuration of resonance trace 5 is not limited to the above-described one and may alternatively have, for example, a shape of a katakana character that is similar to a 90-degree-turned U of the alphabet, a shape of letter U of the alphabet, or a shape of letter II of the Greek alphabet in the plan view. With any of these alternative configurations, resonance trace 5 and circuit member 2 together form loop member 9.

A resonance frequency of resonance trace 5 may include a frequency of an electromagnetic noise entering external interface 3. The resonance frequency of resonance trace 5 may include a communication frequency and a clock frequency both used in circuit member 2.

In the following, a description will be given of functions and effects of printed board 1 according to this embodiment referring to FIGS. 1 and 2.

Regarding printed board 1 according to this embodiment, a major portion of an electromagnetic noise entering casing 3a of external interface 3 from outside printed board 1 propagates on frame ground trace 4 to stable potential 8. The electromagnetic noise is a noise current, for example. The electromagnetic noise does not propagate (or, is not conducted) directly to circuit member 2 because of the presence of slit 7 between frame ground trace 4 and circuit member 2.

However, the electromagnetic noise propagating on frame ground trace 4 contains a high-frequency component (predominantly of several kilohertz or higher) and therefore a part of the electromagnetic noise is spatially coupled to circuit member 2 and resonance trace 5. When this occurs, resonance occurs in resonance trace 5 with the electromagnetic noise within a particular frequency range depending, for example, on the size of the gap between the two positions connected to circuit member 2 and/or on the length of the longitudinal line of the F-shaped part. When resonance occurs in resonance trace 5 with the electromagnetic noise, the electromagnetic noise is converted into heat due to conductor resistance loss in resonance trace 5 and dielectric loss in dielectric 6 near resonance trace 5. This phenomenon reduces the electromagnetic noise. Then, as a result of this reduction in the electromagnetic noise, the electromagnetic noise propagating from casing 3a of external interface 3 to frame ground trace 4 is mitigated from becoming spatially coupled to circuit member 2.

Moreover, loop member 9, which is composed of resonance trace 5 and circuit member 2, confines the electromagnetic noise to resonance trace 5 and circuit member 2, as depicted with the alternate long and short dash line in FIG. 1. Resonance occurs with the electromagnetic noise at a frequency that depends on the length and the area of loop member 9. When resonance thus occurs, a pathway with a low impedance or, in other words, a pathway on which electromagnetic energy can easily propagate is formed. As a result, electromagnetic energy propagates on loop member 9. In other words, a noise current flows through loop member 9. This phenomenon sufficiently reduces propagation of electromagnetic energy to a pathway in which no resonance has occurred. In other words, the electromagnetic noise is confined to loop member 9. This confinement also contributes to mitigation of the electromagnetic noise propagating from casing 3a of external interface 3 to frame ground trace 4 from becoming spatially coupled to circuit member 2.

Figure 2:
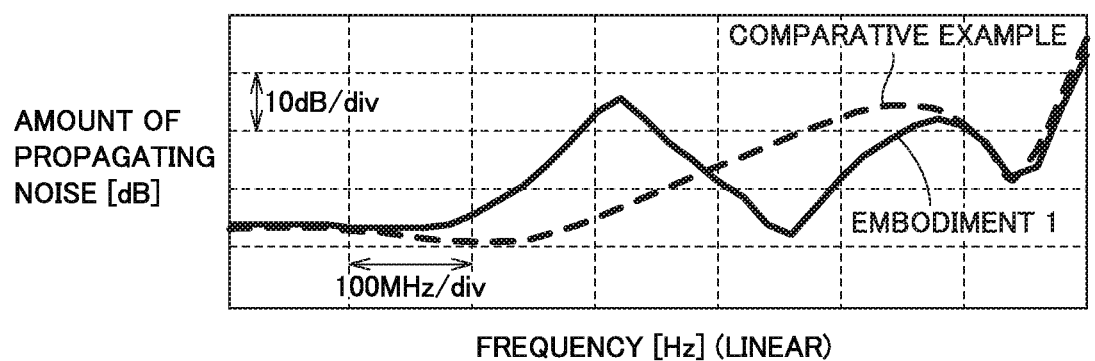
FIG. 2 is a graph depicting results of analysis of the amount of electromagnetic noise propagating in the printed board according to embodiment 1 of the present invention.

FIG. 2 is a graph depicting results of analysis on printed board 1 according to this embodiment. In FIG. 2, the ordinate represents the amount of electromagnetic noise [dB] propagating on frame ground trace 4 from casing 3a of external interface 3 to circuit member 2, and the abscissa represents the frequency [Hz] (linear) of the noise current of the electromagnetic noise.

Figure 3:
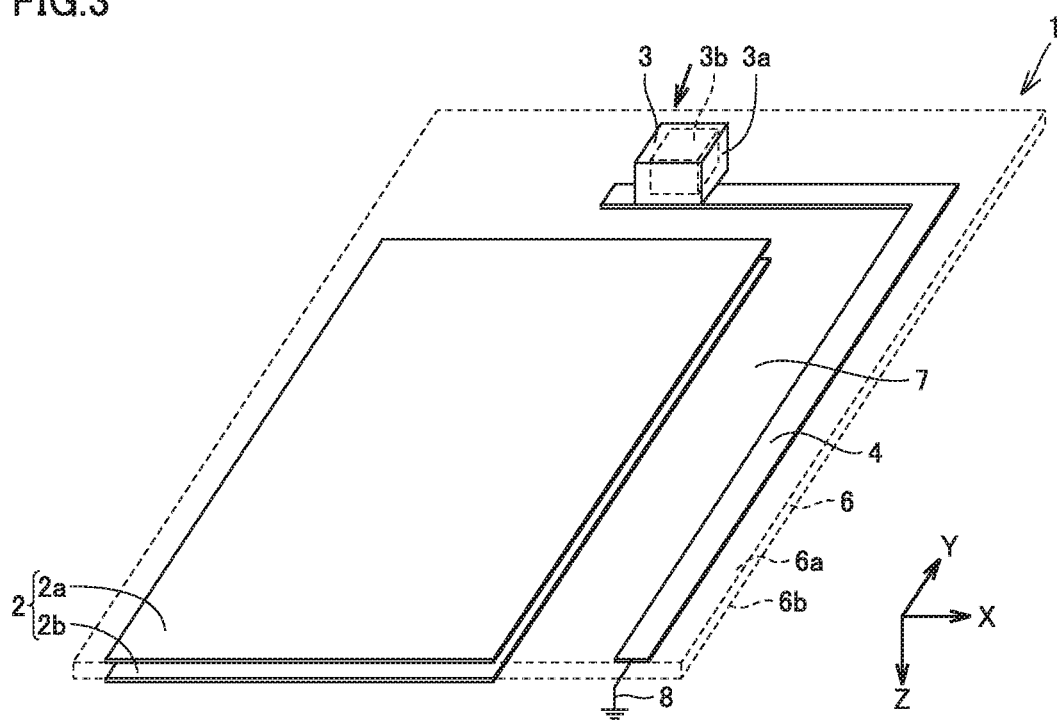
FIG. 3 is a schematic perspective view of the structure of a printed board of a comparative example.

The solid line in the graph in FIG. 2 depicts the amount of electromagnetic noise propagating in printed board 1 according to this embodiment. The dashed line in the graph in FIG. 2 depicts the amount of electromagnetic noise propagating in a printed board 1 of a comparative example. FIG. 3 is a perspective view of printed board 1 of a comparative example. As illustrated in FIG. 3, the structure of printed board 1 of a comparative example is the same as that of printed board 1 according to this embodiment illustrated in FIG. 1 except the absence of resonance trace 5.

As shown in FIG. 2, the amount of electromagnetic noise propagating in printed board 1 according to this embodiment is lower than the amount of electromagnetic noise propagating in printed board 1 of a comparative example at most frequencies. The resonance frequency of resonance trace 5 may be optionally changed by changing the size of the gap between the two positions at which resonance trace 5 is connected to the signal ground trace of circuit member 2, the length of the longitudinal line of the F-shaped part, and/or the width of resonance trace 5. By thus changing the shape of resonance trace 5 (the size of the gap between the two positions at which resonance trace 5 is connected to the signal ground trace of circuit member 2, the length of the longitudinal line of the F-shaped part, and/or the width of resonance trace 5) and thereby adjusting the resonance frequency of resonance trace 5 so that the resonance frequency of resonance trace 5 includes the frequency of the electromagnetic noise, resonance may occur between the electromagnetic noise and resonance trace 5.

Figure 11:
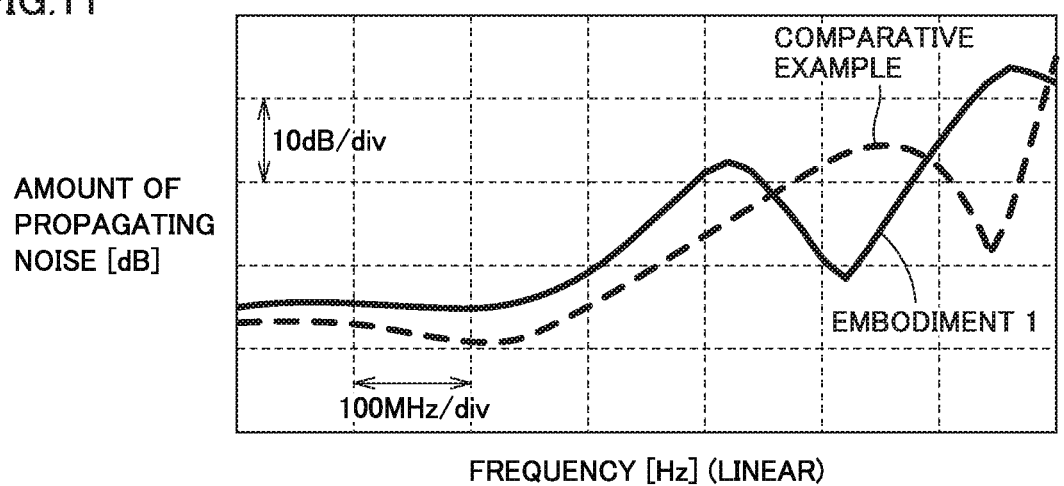
FIG. 11 is a graph depicting the amount of electromagnetic noise propagating in the printed board according to embodiment 1 of the present invention; the graph shows differences observed when the size of the gap between two positions at which a resonance trace is connected to a signal ground trace of a circuit member is changed.

FIG. 11 is a graph depicting the amount of propagating electromagnetic noise; the graph shows differences observed when the size of the gap between the two positions at which resonance trace 5 is connected to the signal ground trace of circuit member 2 is changed.

Figure 12:
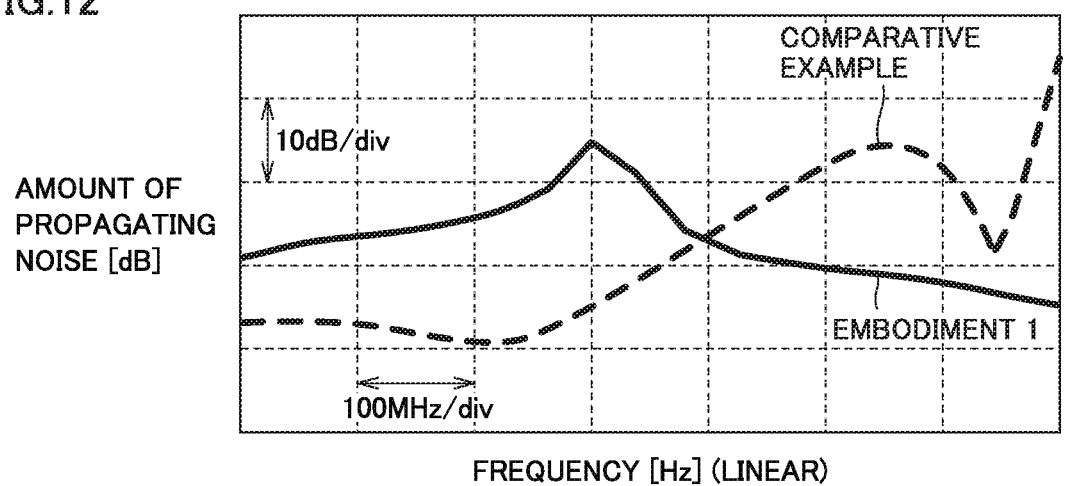
FIG. 12 is a graph depicting the amount of electromagnetic noise propagating in the printed board according to embodiment 1 of the present invention; the graph shows differences observed when the length of the longitudinal line of the F-shaped part is changed.

FIG. 12 is a graph depicting the amount of propagating electromagnetic noise; the graph shows differences observed when the length of the longitudinal line of the F-shaped part is changed.

As is clear from the comparison between FIGS. 2, 11, and 12, the resonance frequency may be adjusted by changing the shape of resonance trace 5. Adjusting the frequency at which the noise current reaches its maximum in FIG. 10 and adjusting the resonance frequency enable reduction in the amount of electromagnetic noise propagating on frame ground trace 4 from casing 3a of external interface 3 to circuit member 2.

As described above, in printed board 1 according to this embodiment, in which resonance trace 5 is disposed between frame ground trace 4 and circuit member 2 with a gap present between resonance trace 5 and frame ground trace 4, an electromagnetic noise from frame ground trace 4 does not propagate (or, is not conducted) directly to circuit member 2. Moreover, the electromagnetic noise that is spatially coupled to resonance trace 5 is converted into heat due to resonance with resonance trace 5. As a result of this phenomenon, the electromagnetic noise propagating on frame ground trace 4 is mitigated from becoming spatially coupled to circuit member 2. Moreover, resonance trace 5 is connected to circuit member 2 at at least two positions. Resonance trace 5 and circuit member 2 together form loop member 9 configured in the form of a closed circuit of resonance trace 5 and circuit member 2. Loop member 9 thus composed of resonance trace 5 and circuit member 2 causes resonance with the electromagnetic noise to occur. In other words, a pathway with a low impedance or, in other words, a pathway on which electromagnetic energy can easily propagate is formed. This phenomenon sufficiently reduces propagation of electromagnetic energy to a pathway in which no resonance has occurred. In this way, the presence of resonance trace 5 enables confinement of the electromagnetic noise to loop member 9. This confinement enables reduction in the amount of electromagnetic noise propagating on frame ground trace 4 to a region of circuit member 2 where a signal trace and a circuit component are mounted. This reduction enables a decrease in the likelihood of a malfunction of circuit member 2 of printed board 1 to occur. Therefore, this configuration is capable of mitigating a malfunction of a circuit component mounted on circuit member 2 from being caused by electromagnetic noise.

With circuit member 2 being spaced from frame ground trace 4, the above-described configuration is capable of mitigating a high voltage application to a region of circuit member 2 where a signal trace and a circuit component are mounted even when external interface 3 receives a surge voltage, which is a momentary high voltage exceeding the voltage range in the stationary state.

Moreover, the resonance frequency of resonance trace 5 of printed board 1 according to this embodiment may include a frequency of an electromagnetic noise entering external interface 3. This configuration enables resonance to occur between resonance trace 5 and the electromagnetic noise and is thereby capable of reducing the amount of electromagnetic noise propagating to circuit member 2.

Moreover, the resonance frequency of resonance trace 5 of printed board 1 according to this embodiment may include a communication frequency and a clock frequency both used in circuit member 2. This configuration is thereby capable of mitigating propagation, to circuit member 2, of an electromagnetic noise including a communication frequency and a clock frequency both used in circuit member 2. Therefore, this configuration is capable of decreasing the likelihood of a malfunction of circuit member 2.

Embodiment 2

Figure 4:
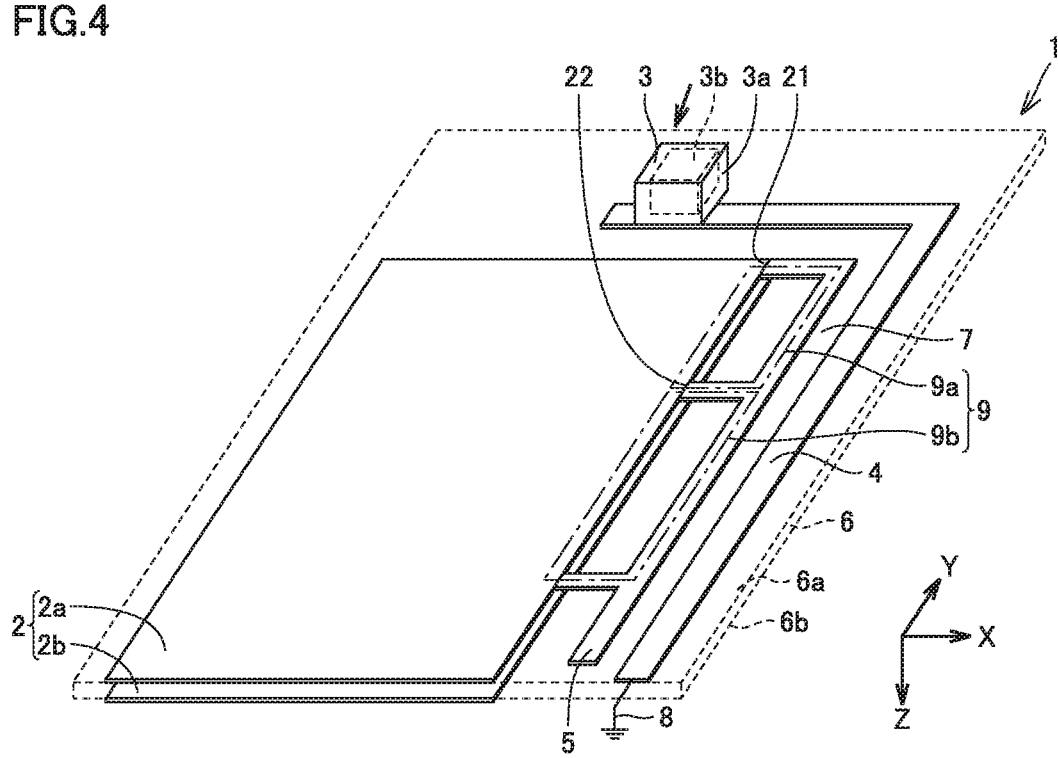
FIG. 4 is a schematic perspective view of the structure of a printed board according to an embodiment 2 of the present invention.

A description will be given of the structure of printed board 1 according to an embodiment 2 of the present invention, referring to FIG. 4. FIG. 4 is a perspective view of printed board 1 according to this embodiment. A major difference between printed board 1 according to this embodiment and printed board 1 according to embodiment 1 is that loop member 9 of printed board 1 according to this embodiment includes a plurality of loop parts.

In printed board 1 according to this embodiment, loop member 9 includes a first loop part 9a and a second loop part 9b. First loop part 9a and second loop part 9b may be different in shape. In printed board 1 according to this embodiment, resonance trace 5 is connected to circuit member 2 at three positions.

Although loop member 9 in FIG. 4 includes two loop parts, loop member 9 may alternatively include three or more loop parts. In other words, although it is described above that the number of positions (connecting positions) at which resonance trace 5 is connected to circuit member 2 is three, the number of the connecting positions is not limited to three and may alternatively be four or more.

In printed board 1 according to this embodiment, first loop part 9a and second loop part 9b enable adjustment of the resonance frequency and of the degree of resonance occurring in resonance trace 5. Therefore, printed board 1 according to this embodiment enables minute adjustment of the resonance frequency and the degree of resonance occurring in resonance trace 5.

Embodiment 3

Figure 5:
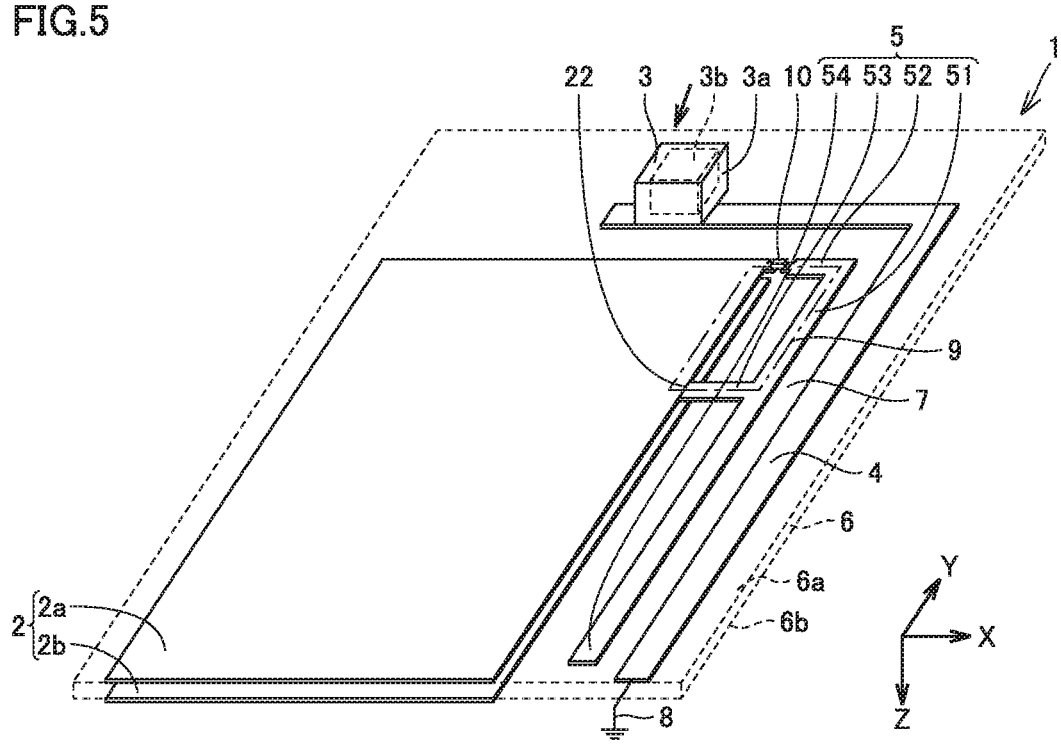
FIG. 5 is a schematic perspective view of the structure of a printed board according to an embodiment 3 of the present invention.

A description will be given of the structure of printed board 1 according to an embodiment 3 of the present invention, referring to FIG. 5. FIG. 5 is a perspective view of printed board 1 according to this embodiment. A major difference between printed board 1 according to this embodiment and printed board 1 according to embodiment 1 is that printed board 1 according to this embodiment includes an electronic component 10.

In printed board 1 according to this embodiment, resonance trace 5 is connected to circuit member 2 via electronic component 10. Examples of electronic component 10 include a resistance, an inductor, and a capacitor.

Although electronic component 10 in FIG. 5 is disposed at one of the two connecting positions on resonance trace 5, this is not mandatory. Electronic component 10 may be disposed at the other one of these two connecting positions or may be disposed at both these two connecting positions.

Moreover, the number of electronic component 10 in FIG. 5 is one but this is not mandatory. A plurality of electronic components 10 may be disposed. The plurality of electronic components 10 may be of the same type (for example, all electronic components 10 may be resistances) or may be of different types (for example, a combination of at least one resistance and at least one inductor or a combination of at least one resistance, at least one inductor, and at least one capacitor may be used). When there are a plurality of electronic components 10, they may be different in their properties (such as capacity).

In printed board 1 according to this embodiment, resonance trace 5 is connected to circuit member 2 via electronic component 10 and, therefore, the resonance frequency and the degree of resonance occurring in resonance trace 5 may be adjusted by adjusting electronic component 10. This configuration enables minute adjustment of the resonance frequency and of the degree of resonance occurring in resonance trace 5.

The resonance frequency varies depending on the impedance characteristics of electronic component 10. When electronic component 10 is a resistance, the resonance frequency varies depending on the real part of the numerical value of the impedance. When electronic component 10 is a combination of an inductor and a capacitor, the resonance frequency varies depending on the imaginary part of the numerical value of the impedance.

When electronic component 10 is an inductor, the resonance frequency may be adjusted by changing the capacity of the inductor. When electronic component 10 is a capacitor, the resonance frequency may be adjusted by changing the capacity of the capacitor. When electronic component 10 is a resistance, electromagnetic noise may be reduced by converting the electromagnetic noise into heat by the resistance.

Embodiment 4

Figure 6:
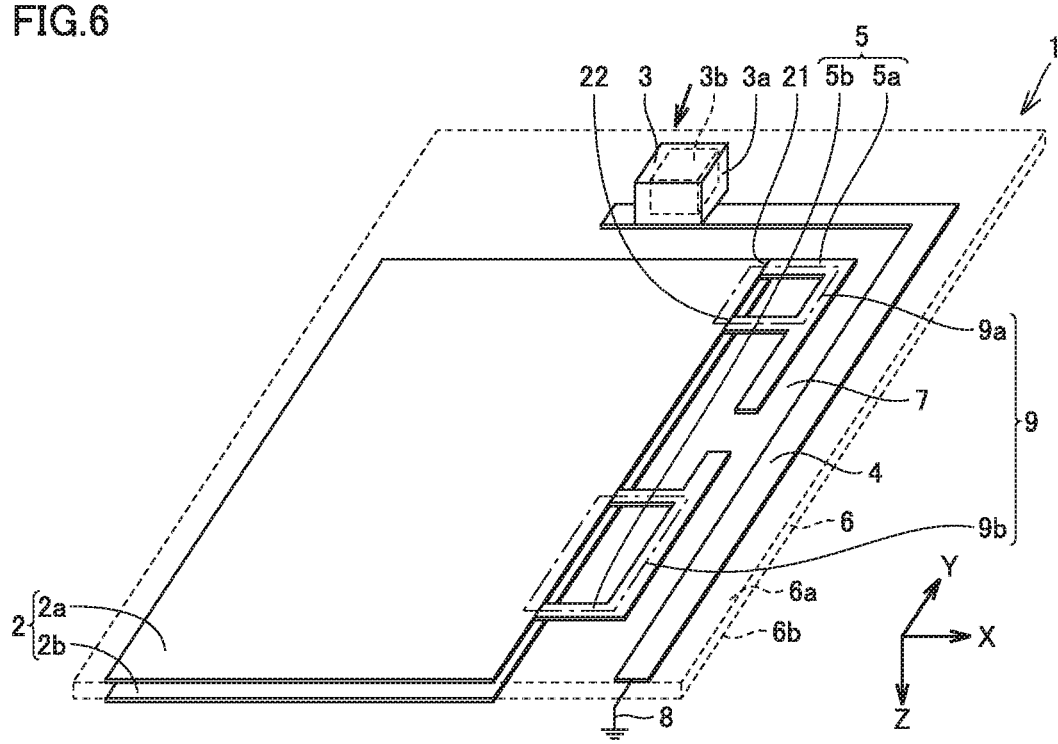
FIG. 6 is a schematic perspective view of the structure of a printed board according to an embodiment 4 of the present invention.

A description will be given of the structure of printed board 1 according to an embodiment 4 of the present invention, referring to FIG. 6. FIG. 6 is a perspective view of printed board 1 according to this embodiment. A major difference between printed board 1 according to this embodiment and printed board 1 according to embodiment 1 is that, in printed board 1 according to this embodiment, resonance trace 5 includes a plurality of resonance trace parts.

In printed board 1 according to this embodiment, resonance trace 5 includes a first resonance trace part 5a, first resonance trace part 5a, and a second resonance trace part 5b and loop member 9 includes first loop part 9a and second loop part 9b.

First resonance trace part 5a is connected to circuit member 2 and constitutes at least part of first loop part 9a. Second resonance trace part 5b is connected to circuit member 2 and constitutes at least part of second loop part 9b. First resonance trace part 5a and second resonance trace part 5b are connected to first circuit part 2a. First loop part 9a and second loop part 9b may be different in shape. Although resonance trace 5 in FIG. 6 includes two resonance trace parts, resonance trace 5 may alternatively include three or more resonance trace parts.

Printed board 1 according to this embodiment enables adjustment of each of a resonance frequency generated in first resonance trace part 5a (a first resonance frequency), a resonance frequency generated in second resonance trace part 5b (a second resonance frequency), and a resonance frequency generated by mutual interference between the first resonance frequency and the second resonance frequency (a third resonance frequency).

Embodiment 5

Figure 7:
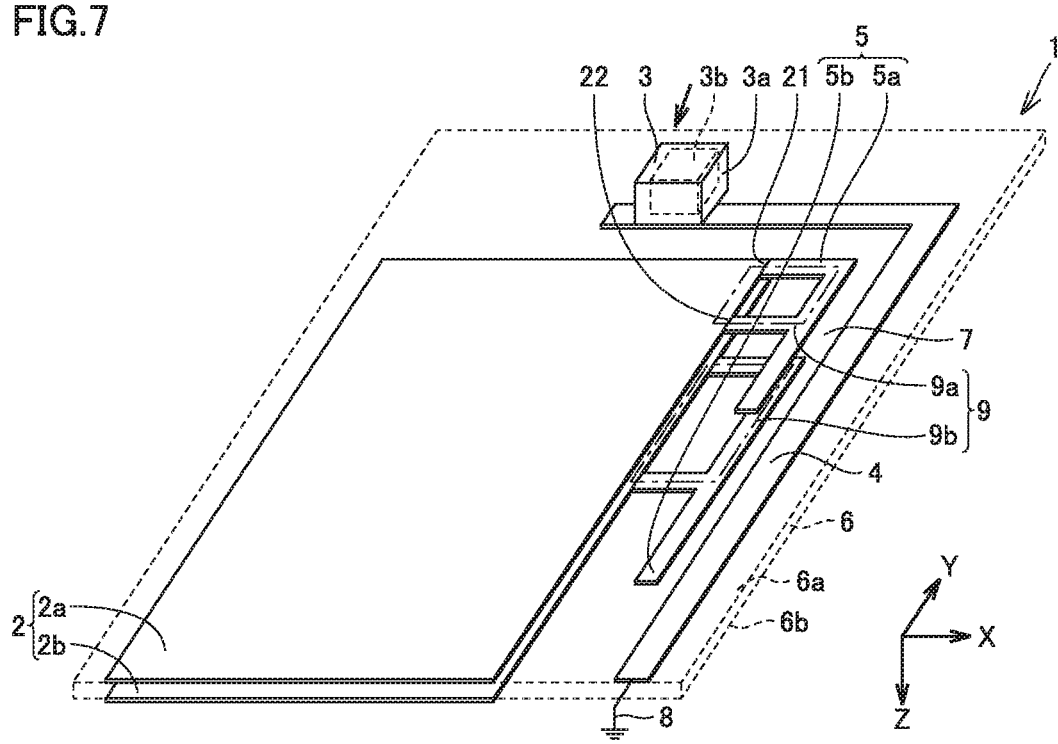
FIG. 7 is a schematic perspective view of the structure of a printed board according to an embodiment 5 of the present invention.

A description will be given of the structure of printed board 1 according to an embodiment 5 of the present invention, referring to FIG. 7. FIG. 7 is a perspective view of printed board 1 according to this embodiment. A major difference between printed board 1 according to this embodiment and printed board 1 according to embodiment 1 is that, in printed board 1 according to this embodiment, resonance trace 5 includes a plurality of resonance trace parts and the plurality of resonance trace parts are connected to a plurality of circuit parts.

In printed board 1 according to this embodiment, resonance trace 5 is composed of a plurality of resonance trace parts and has a multi-layer structure. Circuit member 2 includes first circuit part 2a and second circuit part 2b, and second circuit part 2b is stacked above first circuit part 2a with a gap present between first circuit part 2a and second circuit part 2b. First resonance trace part 5a is connected to first circuit part 2a and constitutes at least part of first loop part 9a. Second resonance trace part 5b is connected to second circuit part 2b and constitutes at least part of second loop part 9b. First loop part 9a and second loop part 9b may be different in shape. Although resonance trace 5 in FIG. 7 includes two resonance trace parts, resonance trace 5 may alternatively include three or more resonance trace parts.

Printed board 1 according to this embodiment enables adjustment of each of a resonance frequency generated in first resonance trace part 5a connected to first circuit part 2a (the first resonance frequency), a resonance frequency generated in second resonance trace part 5b connected to second circuit part 2b (the second resonance frequency), and a resonance frequency generated by mutual interference between the first resonance frequency and the second resonance frequency (the third resonance frequency).

Embodiment 6

Figure 8:
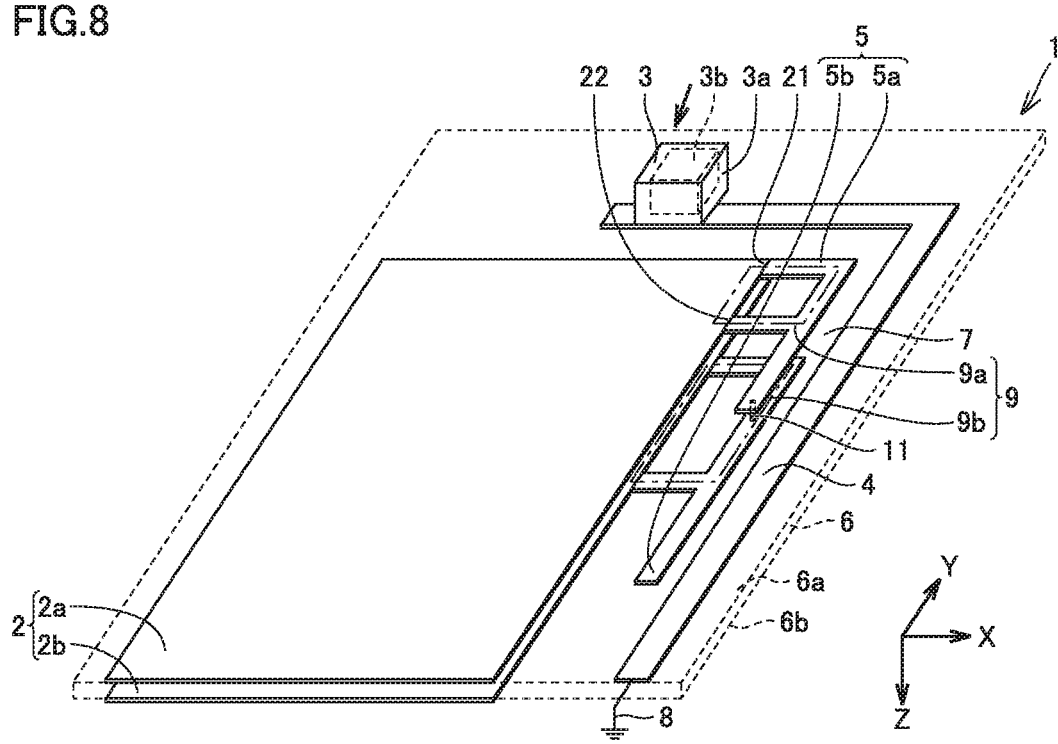
FIG. 8 is a schematic perspective view of the structure of a printed board according to an embodiment 6 of the present invention.

A description will be given of the structure of printed board 1 according to an embodiment 6 of the present invention, referring to FIG. 8. FIG. 8 is a perspective view of printed board 1 according to this embodiment. A major difference between printed board 1 according to this embodiment and printed board 1 according to embodiment 1 is that, in printed board 1 according to this embodiment, resonance trace 5 includes a plurality of resonance trace parts that are electrically connected to each other by a via (conductor) 11.

In printed board 1 according to this embodiment, resonance trace 5 has a multi-layer structure and the plurality of resonance trace parts are electrically connected to each other by via (conductor) 11.

First resonance trace part 5a is connected to first circuit part 2a and constitutes at least part of first loop part 9a. Second resonance trace part 5b is connected to second circuit part 2b and constitutes at least part of second loop part 9b. First loop part 9a and second loop part 9b may be different in shape.

First resonance trace part 5a and second resonance trace part 5b are electrically connected to each other by via (conductor) 11. Via (conductor) 11 is formed in the following manner: a via hole is formed that passes through dielectric 6 interposed between first resonance trace part 5a and second resonance trace part 5b; and then a conductor is disposed inside the resulting via hole. The number of via (conductor) 11 is not limited to one and may alternatively be more than one.

In printed board 1 according to this embodiment, first resonance trace part 5a and second resonance trace part 5b are electrically connected to each other and, therefore, this configuration is capable of forming a single resonance from a combination of first resonance trace part 5a and second resonance trace part 5b.

Embodiment 7

Figure 9:
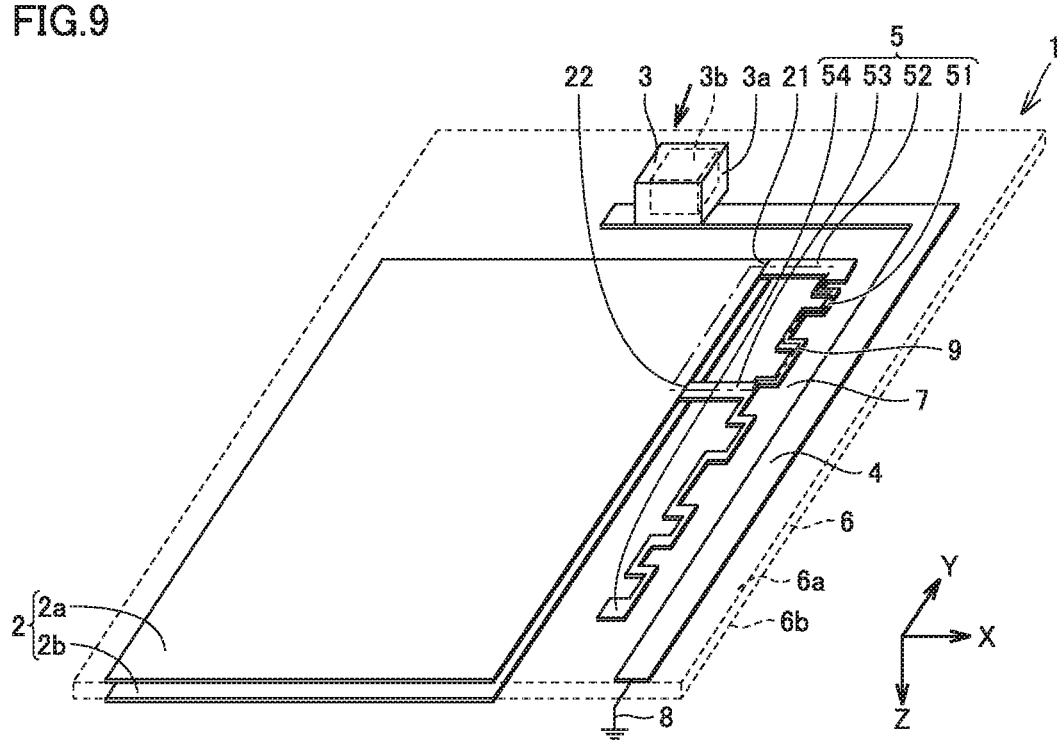
FIG. 9 is a schematic perspective view of the structure of a printed board according to an embodiment 7 of the present invention.

A description will be given of the structure of printed board 1 according to an embodiment 7 of the present invention, referring to FIG. 9. FIG. 9 is a perspective view of printed board 1 according to this embodiment. A major difference between printed board 1 according to this embodiment and printed board 1 according to embodiment 1 is the shape of resonance trace 5.

In this embodiment, resonance trace 5 has a zigzag shape. Resonance trace 5 makes its way in a zigzag pattern on one surface (first surface) 6a of dielectric 6 in an in-plane direction of this surface.

In printed board 1 according to this embodiment, resonance trace 5 has a zigzag shape. Gaps in the zigzag pattern of resonance trace 5 and the width of resonance trace 5 may be adjusted so as to adjust the resonance frequency generated in resonance trace 5. In addition, the zigzag pattern increases the length of the trace. This also enables adjustment of the resonance frequency generated in resonance trace 5.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 printed board; 2 circuit member; 2a first circuit part; 2b second circuit part; 3 external interface; 4 frame ground trace; 5 resonance trace; 5a first resonance trace part; 5b second resonance trace part; 6 dielectric; 7 slit; 8 stable potential; 9 loop member; 9a first loop part; 9b second loop part; 10 electronic component; 11 via

The invention claimed is:

1. A printed board, comprising:
an external interface;
a frame ground trace electrically connected to the external interface;
a circuit structure spaced from the frame ground trace; and
a resonance trace disposed between the frame ground trace and the circuit structure with a gap present between the resonance trace and the frame ground trace, wherein
the resonance trace is connected to the circuit structure at at least two positions,
the resonance trace and the circuit structure together form a loop structure configured in a form of a closed circuit of the resonance trace and the circuit structure,
the resonance trace includes a first resonance trace part and a second resonance trace part,
the loop structure includes a first loop part and a second loop part,
the first resonance trace part is connected to the circuit structure and constitutes at least part of the first loop part,
the second resonance trace part is connected to the circuit structure and constitutes at least part of the second loop part,
the circuit structure includes a first circuit part and a second circuit part,
the second circuit part is stacked above the first circuit part with a gap present between the first circuit part and the second circuit part,
the first resonance trace part is connected to the first circuit part and constitutes at least part of the first loop part, and
the second resonance trace part is connected to the second circuit part and constitutes at least part of the second loop part.

2. The printed board according to claim 1, wherein the resonance trace is connected to the circuit structure with an electronic component interposed between the resonance trace and the circuit structure.

3. The printed board according to claim 1, wherein the first resonance trace part and the second resonance trace part are electrically connected to each other.

4. The printed board according to claim 1, wherein the resonance trace has a zigzag shape.

5. The printed board according to claim 1, wherein the resonance trace has a resonance frequency, the resonance frequency of the resonance trace includes a frequency of an electromagnetic noise entering the external interface.

6. The printed board according to claim 1, wherein the resonance frequency of the resonance trace includes a communication frequency and a clock frequency both used in the circuit structure.

* * * * *